United States Patent [19]

Nomura et al.

[11] Patent Number: 5,073,805

[45] Date of Patent: Dec. 17, 1991

[54] SEMICONDUCTOR LIGHT EMITTING DEVICE INCLUDING A HOLE BARRIER CONTIGUOUS TO AN ACTIVE LAYER

[75] Inventors: Yoshinori Nomura; Hitoshi Ogata, both of Hyogo, Japan

[73] Assignee: Optoelectronics Technology Research Corporation, Tokyo, Japan

[21] Appl. No.: 658,455

[22] Filed: Feb. 22, 1991

Related U.S. Application Data

[63] Continuation of Ser. No. 306,605, Feb. 6, 1989, abandoned.

[51] Int. Cl.$^5$ ............................................. H01L 33/00
[52] U.S. Cl. ........................................ 357/17; 357/16; 357/30; 372/43; 372/50
[58] Field of Search .................... 357/17, 16, 4, 30 B, 357/30 E; 372/43, 45, 42

[56] References Cited

U.S. PATENT DOCUMENTS

| | | | |
|---|---|---|---|
| 4,575,852 | 3/1986 | Fujimoto et al. | 357/16 |
| 4,602,370 | 7/1986 | Tsang | 357/16 |
| 4,775,876 | 10/1988 | Moyer | 357/4 |
| 4,847,573 | 7/1989 | Fukuzawa et al. | 357/17 |
| 4,862,471 | 8/1989 | Pankove | 357/17 |

FOREIGN PATENT DOCUMENTS

| | | | |
|---|---|---|---|
| 0013681 | 1/1986 | Japan | 372/43 |
| 0002676 | 1/1987 | Japan | 357/17 |
| 0089390 | 4/1987 | Japan | 372/43 |
| 0252492 | 10/1988 | Japan | 372/43 |
| 0037880 | 2/1989 | Japan | 357/16 |

OTHER PUBLICATIONS

Proceedings of the 35th Joint Conference on Applied Physics, JSAP Catalog No.: AP 881105-03, p. 802.
XVI Int'l Conf. on Quantum Electronics, Y. Nomura et al, "Wide Modulation Bandwidth ... Laser", pp. 54–55 (7/88).
"Gain-Switching Characteristics and Fast Transient Response of Three-Terminal Size-Effect Modulation Laser", Suemune et al, IEEE Journal of Quantum Electronics, vol. QE-22, No. 9, Sep. 1986, pp. 1900–1908.

Primary Examiner—Jerome Jackson, Jr.
Assistant Examiner—Hung Xuan Dang
Attorney, Agent, or Firm—Sughrue, Mion, Zinn, Macpeak & Seas

[57] ABSTRACT

In a semiconductor light emitting device comprising an active layer, a hole barrier layer is formed in contact with a first surface of the active layer to provide a barrier against holes in the active layer. The barrier layer does not provide a barrier against electrons tunnelling therethrough. A low energy band gap layer is formed on the barrier layer to have a conduction band minimum which is lower than the conduction band minimum of the active layer at least in a part adjacent to the barrier layer. First and second electrodes are in ohmic contact with an n-type and a p-type conductivity layers which are formed on the low energy band gap layer and a second surface of the active layer, respectively. Preferably, the p-type conductivity layer comprises an electron barrier layer on the second surface, a waveguide layer formed on the electron barrier layer to have an energy band gap wider than an energy band gap of the active layer, and a remaining layer formed between the waveguide layer and the second electrode to have an energy band gap wider than the emergy band gap of the waveguide layer. The waveguide layer may be removable without losing high speed capability of the laser.

5 Claims, 5 Drawing Sheets

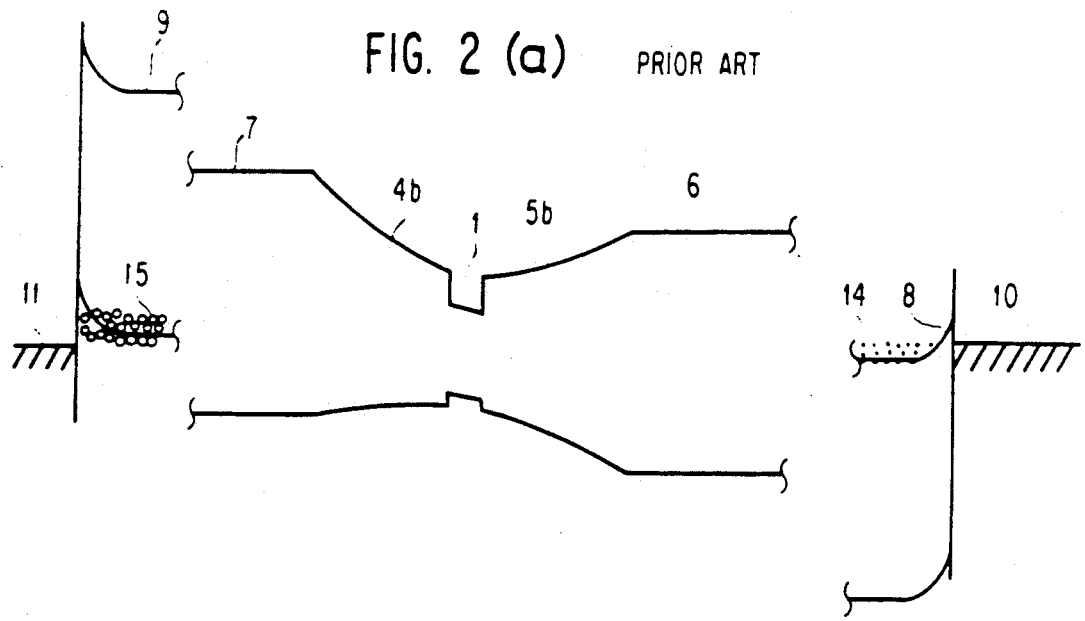
FIG. 2 (a) PRIOR ART
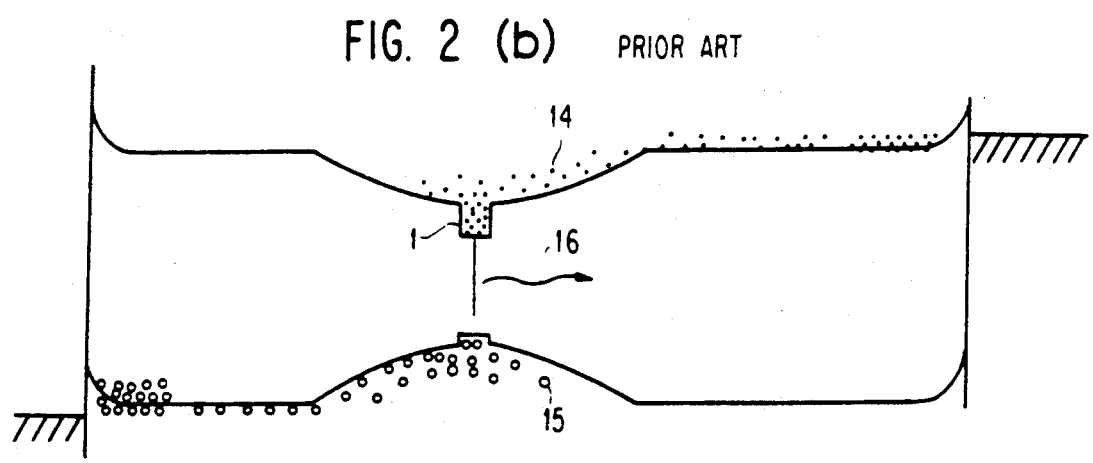
FIG. 2 (b) PRIOR ART
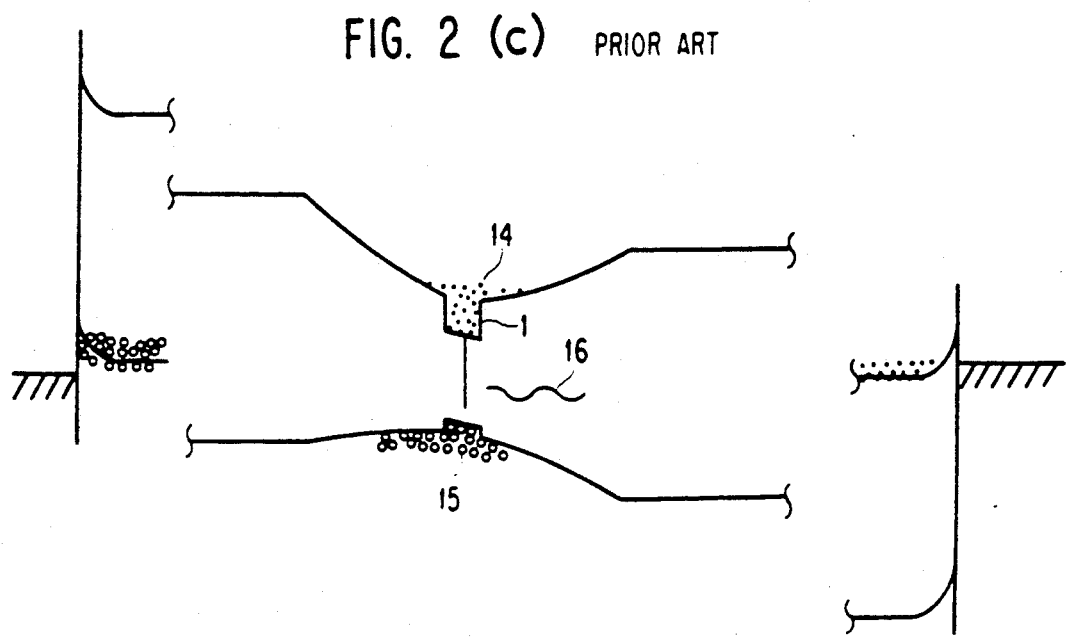
FIG. 2 (c) PRIOR ART

SEMICONDUCTOR LIGHT EMITTING DEVICE INCLUDING A HOLE BARRIER CONTIGUOUS TO AN ACTIVE LAYER

This is a continuation of application Ser. No. 07/306,605 filed Feb. 6, 1989 now abandoned.

BACKGROUND OF THE INVENTION

This invention relates to a semiconductor light emitting device, which may be either a semiconductor laser or a semiconductor light emitting diode (LED).

Such semiconductor light emitting devices are widely used in optical communication networks. Semiconductor lasers are generally capable of high speed direct modulation than LED's. Hence, this invention will be described in focus on lasers, although the invention can be applied to both lasers and LED's.

As will be described in detail later, a conventional semiconductor laser comprises an active layer in which free carriers are present to contribute to emission of light through recombination. First and second cladding layers are on both sides of the active layer to confine optical wave and the carriers to the active layer. The first cladding layer has a p-type conductivity. The second cladding layer has an n-type conductivity. First and second electrodes are in ohmic contact with the first and the second cladding layers, respectively.

Various high-speed semiconductor lasers have been already known. Modulation speed is, however, restricted due to a delay involved in the process of emitting light. It is known that the delay includes a life time of carriers as a parameter.

SUMMARY OF THE INVENTION

It is therefore an object of the present invention to provide a semiconductor light emitting device which has an apparently reduced carrier life time to be operable at a high speed.

Other objects of this invention will become clear as the description proceeds.

According to this invention, there is provided a semiconductor light emitting device comprising (A) an active layer of which we denote each side as a first and a second surface, (B) a hole barrier layer which acts as a barrier against holes and is formed on the first surface to have a third and a fourth surface and with the third surface brought into contact with the first surface, (C) a low energy band gap layer which is formed on the fourth surface and has the same conduction band minimum at the fourth surface as that of said active layer, (D) an n-type conductivity layer on the low energy band gap layer, (E) a first electrode in ohmic contact with the n-type conductivity layer, (F) a p-type conductivity layer on the second surface, a (G) a second electrode in ohmic contact with the p-type conductivity layer.

BRIEF DESCRIPTION OF THE DRAWING

FIGS. 2(A), (B), and (C) are diagram showing band structures of the semiconductor laser illustrated in FIG. 1;

DESCRIPTION OF THE PREFERRED EMBODIMENT

Figure 1:
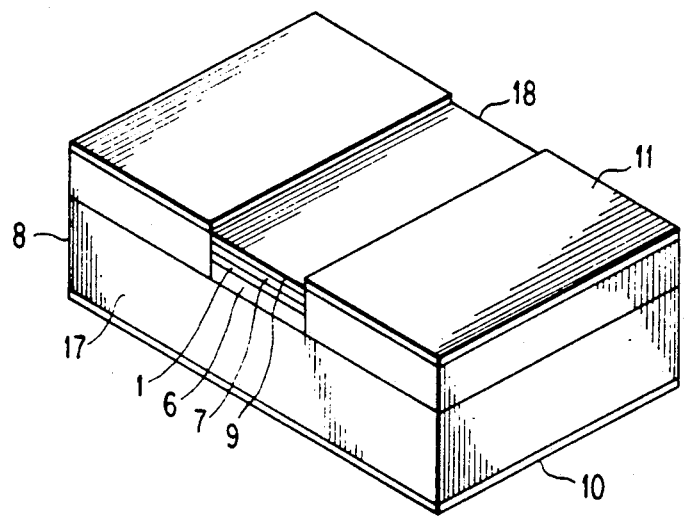
FIG. 1 is a schematic perspective view of a main part of a conventional semiconductor laser.

Referring to FIG. 1, a conventional semiconductor laser will be described at first in order to facilitate an understanding of the present invention. In the figure, reference numeral 1 designates an active layer in which carriers are subjected to radiactive recombinations. First and second cladding layers 6 and 7 are provided so as to confine carriers and lightwaves. Reference numeral 8 shows a highly doped n-type substrate. Reference numeral 9 indicates a highly doped p-type layer. First and second electrodes 10 and 11 are provided for injecting an electric current. Cleavage planes 17 and 18 constitute a Fabry-Perot etalon resonator. Intensity-modulated output light is obtained by modulating the electric current.

In connection with the conventional laser constituted as above, the following is known as the major causes which restrict high speed operation of the semiconductor laser: (1) parasitic capacitances and (2) a time delay involved in the light emitting process.

A letter is contributed by J. E. Bowers et al. to the "Electron. Lett." 21, 1090 (1985). According to the Bowers et al. Electronics Letters, the parasitic capacitances can be reduced by adopting a ridge-waveguide type structure. They obtained a bandwidth of 26 GHz at a low temperature. Hence, it is essential to solve the second problem for further improvement.

It is well known that a relaxation oscillation appears in the output light intensity for a step-wise injection current. Generally, modulation depth steeply decreases for higher frequencies than that of the relaxation oscillation. Accordingly, the frequency of the relaxation oscillation is a good measure of the band width of the laser.

According to an article contributed to the IEEE Quantum Electronics, Volume QE-21 (1985), page 21, the relaxation oscillation frequency, $f_R$, is given by:

$$f_R = [(\Gamma N_{om} A \tau_p + 1) \times (J/J_{th} - 1)/(\tau_s \tau_p)]^{\frac{1}{2}}/(2\pi), \quad (1)$$

where $\Gamma$ is the confinement factor, $N_{om}$ is the carrier density at which the active layer becomes transparent for the lasing wavelength, A is the differential gain, $\tau_p$ is the photon life time, $\tau T_s$ is the carrier life time, $J_{th}$ is the threshold current density, and J is the injection current density.

It has been experimentally demonstrated that the reduction of $\tau_p$ with short cavities and the increases of the differential gain with quantum well structures are effective, as expected from equation (1), for the increase of the relaxation oscillation. It is also obvious from equation (1) that the decrease of $\tau_2$ increases the $f_R$.

This invention provides a semiconductor light emitting device of a structure that permits an apparent reduction of the carrier life time $\tau_s$ and hence improves the modulation band width of the laser. In order to understand the improvement in the device, it will be helpful to interpret how a long $\tau_s$ degrades the bit rate in a light communication system. We consider operation of a prior art semiconductor laser under pulse injection current.

FIGS. 2(A), (B), and (C) show band structures of a prior art semiconductor laser which is a (graded refractive index)-(separate confinement heterostructure)-(single quantum well) laser (hereinafter referred to as "GRIN-SCH-SQW" or "GRIN" laser). We cite here the quantum well laser instead of the double heterostructure laser cited-above, because a quantum well structure has been proven to bring about high differential gain and hence to have an advantage in high speed operation. Furthermore, the quantum well structure is more closely related to a semiconductor laser according to this invention than the double deterostructure lasers, as details will be described later. FIG. 2(A) shows the energy band structure of the laser in a thermal equilibrium. FIG. 2(B) shows that in current injection with a forward bias voltage. FIG. 2(C) shows that in a state immediately after the forward bias voltage is rapidly and stepwise removed or lowered.

In FIGS. 2(A) through (C), the active layer 1 is made so thin as to form a quantum well. Reference numerals 4b and 5b designate graded refractive index waveguide layers. Cladding layers 6 and 7 have n-type and p-type conductivities, respectively. The highly doped n-type substrate 8 and the highly doped p-type layer 9 offer ohmic contacts with an n-side or first electrode 10 and a p-side or second electrode 11, respectively. Reference numeral 14 designates electrons. Reference numeral 15 designates holes. Reference numeral 16 designates light generated by recombinations of electrons and holes. It is to be noted that the respective graded refractive index layers 4b and 5b together with the cladding layers 6 and 7 have conduction band minima which are higher than that of the active layer 1.

Figure 3:
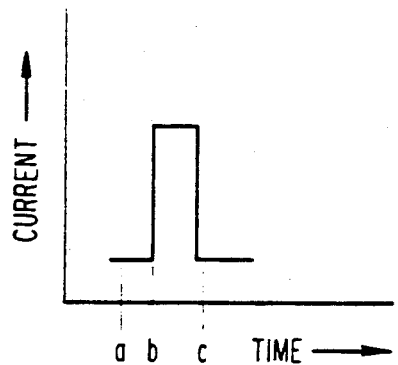
FIG. 3 shows a waveform of a modulation current.

FIG. 3 is a diagram showing a waveform of a pulse shaped current which is injected into the conventional GRIN-SCH-SQW laser. At the timing a when there is no injection current, the band structure is in a state where there are no electrons or holes in the active layer 1 as shown in FIG. 2(A). Therefore, no light emission recombination occurs. At the timing b when the current is injected by applying forward bias voltage between the electrodes 10 and 11, the band structure becomes as shown in FIG. 2(B). A high carrier density takes place in the active layer 1, thereby radiative recombination occurs to generate the light 16. If the densities of the injected electron and hole are sufficiently high, a laser oscillation occurs by the aid of the Fabry-Perot etalon resonator constituted of cleavage surfaces 17 and 18 shown in FIG. 1.

Immediately after the current injection is cut off, that is, at the timing c shown in FIG. 3, electrons and holes are remaining in the active layer 1 and their numbers are reduced through radiative recombination only with a passage of time, although a current is cut off as shown in FIG. 2(C).

As a result, the generated light intensity trails after the cutting off of the current during a time interval which is determined by a radiative recombination rate. As is shown in FIG. 4, this trailing results in a lowering of modulation speed.

Figure 4:
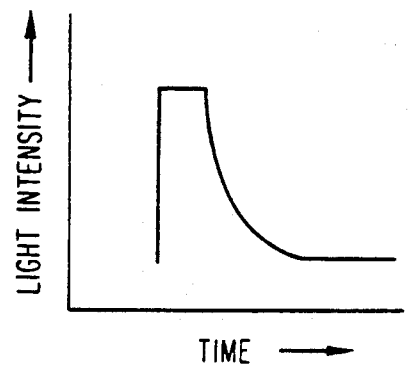
FIG. 4 shows a modulated optical intensity obtained by the semiconductor laser depicted in FIG. 1.

The trailing time of the light intensity after the cutting off of the current is clearingly shown in FIG. 4. The trailing time becomes longer as the carrier life time $\tau_s$ increases. However, it is difficult to appreciably shorten the trailing time because the carrier life time $\tau_s$ is almost inherent to the material of the active layer.

In order to solve the above-mentioned problem, a concept of apparent reduction of the carrier life time $\tau_s$ is introduced into equation (1) in accordance with this invention.

Figure 5:
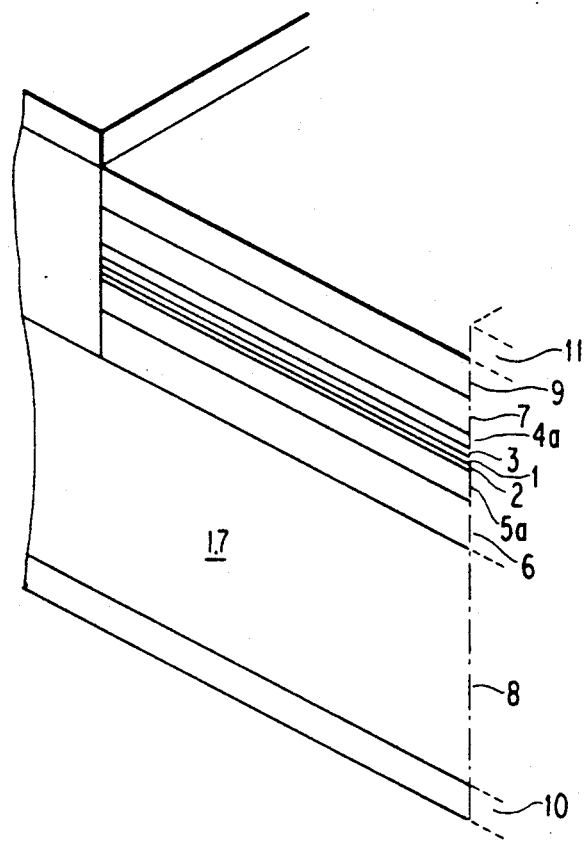
FIG. 5 is a schematic perspective view of a semiconductor laser according to an embodiment of the present invention.

Referring now to FIG. 5 which is a perspective view showing a main part of a semiconductor laser according to a preferred embodiment of this invention. Stripe-shaped epitaxial layers indicated by reference numerals 6, 5a, 2, 1, 3, 4a, 7, and 9 are successively formed on an n-type InP substrate 8. Reference numerals 10 and 11 denote first and second electrodes. A cleaved facet 17 and another facet 18 from a Fabry-Perot etalon resonator for the laser. The stripe of epitaxial layers in perpendicular to the facets.

FIGS. 6(A), (B), and (C) show diagrams showing a band structure of the semiconductor laser of FIG. 5. FIG. 6(A) shows the state wherein the device is in a thermal equilibrium state. FIG. 6(B) shows the state where a current is injected with a forward voltage applied. FIG. 6(C) shows the state immediately after the applied voltage is rapidly lowered.

Figure 6:
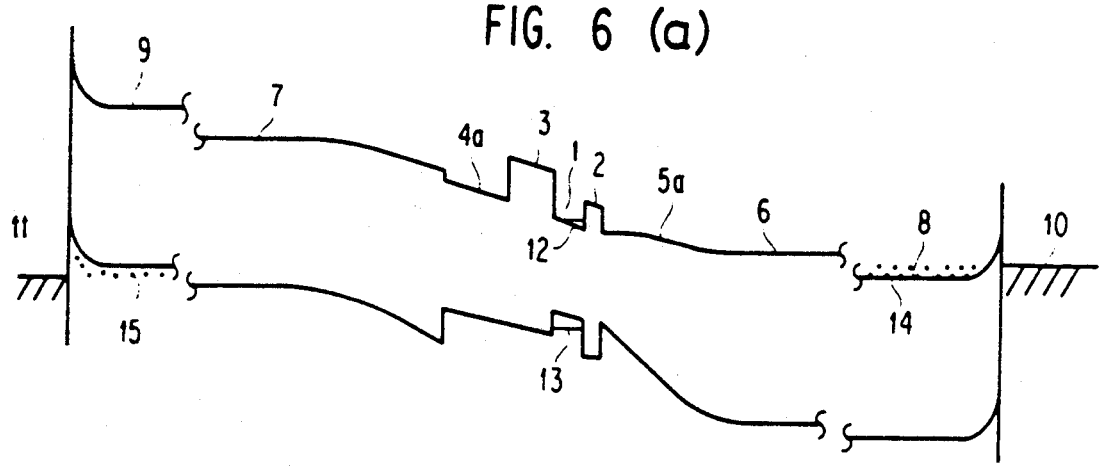
FIGS. 6(A), (B), and (C) show band structures in the semiconductor laser depicted in FIG. 5.
Figure 6:
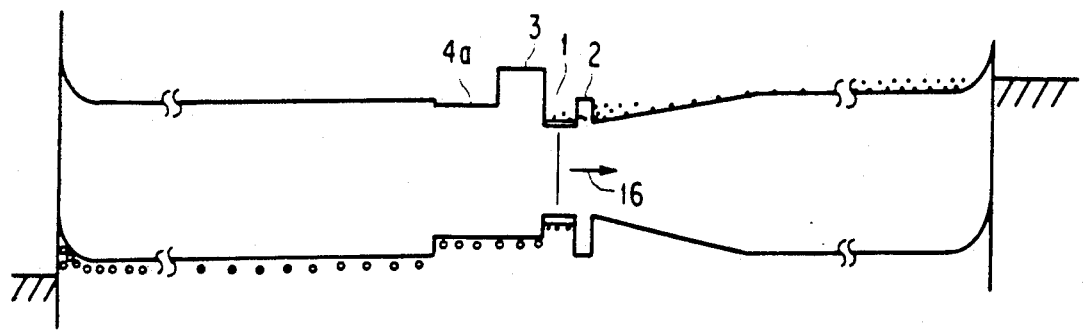
Figure 6:
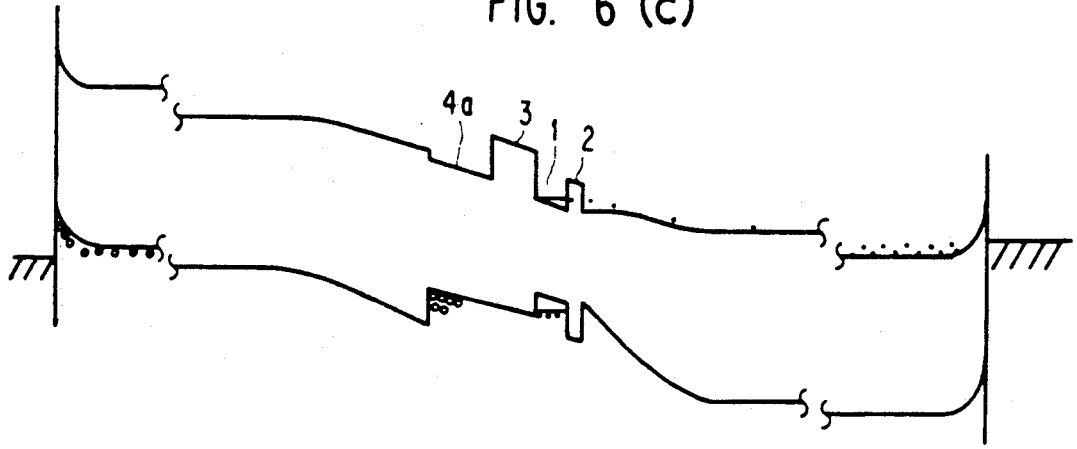

In FIGS. 5 and 6, reference numeral 1 designates a quantum well or active layer of $In_{0.53}Ga_{0.47}As$. The well has a thickness which should be determined so that the desired wavelength would be obtained. Quantum levels become appreciable when the quantum well is thinner than about 40 nm. The well thickness should be 14 nm for a 1.55-micron wavelength. Reference numeral 2 designates a first thin barrier layer of InP located in contact with the active layer 1. The barrier acts as "a mass filter" that transmits, through tunnelling, particles with a light effective mass, such as electrons, but does not transmit heavy particles like holes. Reference numeral 3 designates a second barrier layer if $In_{0.52}Al_{0.48}As$ located on the other side of the active layer 1. The second barrier confines the electrons within the active layer 1. Reference numeral 4a designates an InGaAsP waveguide layer having such a composition that the valence band top is lower than that of the second barrier layer 3 and so that the waveguide layer 4a is lattice-matched to the cladding layer (p-type InP layer) 7. In addition, the energy band gap of the waveguide layer 4a is larger than that of the active layer but is smaller than that of the p-type InP layer 7.

The valence band top of the second barrier 3 is lower than that of the active layer. Thus, the height of the valence band top is descending order from the active layer to the p-type InP layer.

Reference numeral 5a designates a graded low-energy band gap layer of an n-type. The layer 5a has a composition of $In_{0.53}Ga_{0.47}As$ at a position in contact with the first barrier layer 2, and hence, at the position, the conduction band minimum of the graded low-energy band gap layer is lower than the energy levels of those free electrons which are included in the active layer 1 and contribute to emission of light. A band gap of the graded low energy gap layer 5a becomes gradually wider away from the first barrier 2, and coincides with the band gap of the cladding layer (n-type layer) 6. In the active layer 1, reference numerals 12 and 13 designate the lowest quantum levels in the conduction band and in the valence band, respectively.

Numerical examples for some important structural parameters of the laser are listed in Table I.

TABLE I

Structural Parameters for the Laser based on the Invention

| Layer | Material | Thickness (nm) |
|---|---|---|
| Quantum Well | $In_{0.53}Ga_{0.47}As$ | 14 |
| First Barrier Layer | InP | 3 |
| Second Barrier Layer | $In_{0.52}Al_{0.48}As$ | 50 |
| Waveguide | $In_xGa_{1-x}As_yP_{1-y}$ | 100 |
| Low Energy Bandgap Layer | Graded from $In_{0.53}Ga_{0.47}As$ to InP | 100 |

Figure 7:
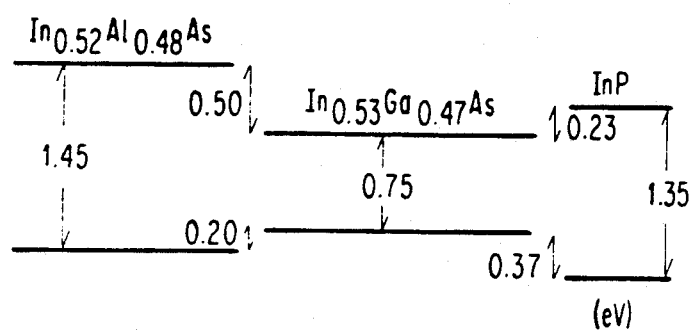
FIG. 7 shows band discontinuities in an $IN_{0.52}Al_{0.48}As/In_{0.53}Ga_{0.47}As/InP$ heterostructure.

Band discontinuities for an $In_{0.52}Al_{0.48}As/In_{0.53}Ga_{0.47}As/InP$ heterostructure are given in FIG. 7. An acceptor concentration of $5 \times 10^{17} cm^{-3}$ is adequate in the p-type cladding layer 7, the waveguide layer 4a, and the second barrier layer 3. A donor concentration of $5 \times 10^{17} cm^{-3}$ is adequate in the low energy band gap layer and n-type cladding layer. For ohmic contacts, a dopant concentration more than $10^{18} cm^{-3}$ of each type carrier is required in the substrate 8 and the outermost part 9 of the p-type InP 7.

The well width of 14 nm is for devices which emit the laser light with a wavelength within a region of 1.55 microns. The width is more narrow for devices which emit laser light of a 1.3-micron wavelength. Wavelengths of 1.3 and 1.55 microns correspond to the low loss wavelength regions for optical fibers.

The device is operated as follows.

FIG. 6(B) shows a state where a forward bias voltage corresponding to a built-in potential is applied through the electrodes 10 and 11. In this state, holes 15 are injected into the active layer 1 by diffusion from the p-type InP layer 9. The electrons 14 are accumulated by diffusion in the graded low energy band gap layer 5a, especially at the boundary between the layer and a first barrier layer 2. When this electron density becomes dense enough, some electrons, due to band filling, will have energy higher than the quantum level 12 in the active layer 1, and tunnel into the active layer 1 through the first barrier layer 2. Electrons and holes injected thereby into the active layer 1 are recombined to generate the light 16.

The internal layers 5a, 2, 1, 3, and 4a act as a waveguide, because the layers have on average smaller energy band gaps than those of InP layers 6 and 7. When a resonator of Fabry-Perot etalon or distributed feedback type is properly constructed, a laser oscillation will occur on the basis of the above-described light generation process.

Figure 8:
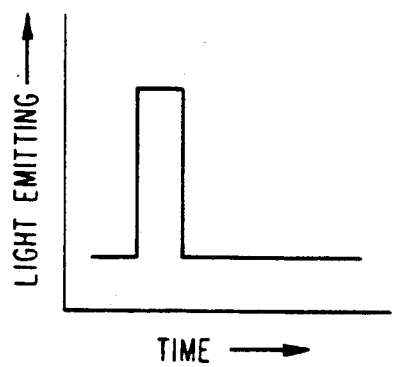
FIG. 8 shows a modulated optical intensity which is achieved by the semiconductor laser depicted in FIG. 1.

Next, we interpret the case where the applied voltage is rapidly lowered as shown in FIG. 6(C). Holes in the active layer 1 cannot transmit through the second barrier layer 3, and a portion of holes remains in the active layer 1. On the other hand, electrons are removed from the graded low energy band gap layer 5a by diffusion or drift conduction. Furthermore, electrons in the active layer 1 pass through the barrier 2 and enter the graded energy band gap layer 5a through tunnelling when energy levels equal to those of the electrons have become empty in the graded low energy band gap layer 5a. Then, similarly as above, these electrons move toward the n-type conductivity layer 6 from the low energy band gap layer 5a. Electrons and holes are, thus, spatially apart from each other, and thereby light emission due to recombination is stopped. Since the electron tunnelling time is about 1 ps as shown in "Jpn. J. Appl. Phys." 25, L871 (1986), this is quite short compared with carrier recombination life time of about 1 ns. FIG. 8 is a diagram showing a waveform of the above-mentioned modulated output light intensity. Thus, the above-mentioned modulated output light intensity. Thus, the above-described light emission is very quickly stopped in the above-mentioned device in comparison with a prior art semiconductor laser in which light emission is stopped after reduction of the carrier number through recombination in the active layer 1.

In order to keep the quantum efficiency at a high value, it is quite important that holes in the active layer 1 cannot tunnel through the barrier and cannot reach the graded low energy band gap layer 5a. Tunnelling probability is approximately represented by the following formula (IEEE J. Quantum Electron. QE-22, 1853 (1986)).

$$T \approx \exp[-L \sqrt{8m\Delta E/\hbar^2}] \quad (2)$$

Herein, m: the effective mass of electron or hole
$\Delta E$: the difference between the quantum level and barrier height
L: the thickness of the first barrier layer 2
$\hbar$: Plank's constant divided by $2\pi$ The tunnelling probability for electrons is larger by five orders of magnitude than that of holes, as calculated from equation (2) by assuming the material system tabulated in Table 1. Effective masses of an electron and hole are 0.077 $m_0$ and 0.64 $m_0$ in InP, respectively, where $m_0$ is the rest mass of an electron.

So far we have described, as an embodiment of the invention, the lasers having a quantum well active layer. More thick active layers made from material with the required band gap are also available. However, in this case, differential gain will not be so high as quantum well lasers.

In the above-illustrated embodiment, the thickness of the waveguide layer 4a can be determined freely. For example, a zero thickness may be used without loosing the above-described fast modulation operation.

$In_{0.52}Al_{0.48}As$ which is used in the second barrier layer 3 can be used instead of the waveguide layer 4a and InP layers 7 and 9.

Furthermore, the second barrier layer 3 and the waveguide layer 4a may be constructed such that the valence band maxima of the p-type conductivity layers 7, 3, and 4a line up risingly. In such a construction, holes are injected smoothly into the active layer. The second barrier layer 3 may not be always necessary.

While in the above-illustrated embodiment a semiconductor laser is described, the invention can also be applied to a light emitting diode.

To summarize, the semiconductor light emitting device according to the present invention includes an active layer. In contact with the active layer, a first barrier layer is formed through which electrons can tunnel but holes cannot tunnel. In contact with the first barrier layer, a low energy band gap layer is formed to have a conduction band minimum lower than the energy levels in the active layer at least at an adjacent part to the first barrier layer. Thereby, not only electrons can be injected into the active layer but also electrons can be taken out to the low energy band gap layer from the active layer at a high speed by varying the applied voltage. Thus, the semiconductor light emitting device operates very fast.

What is claimed is:

1. A semiconductor light emitting device comprising:
   a quantum well which has opposed surfaces and a predetermined band gap and which receives both injected electrons and holes to emit light on recombination of said electrons and said holes;
   a p-type layer which is located over one side of said opposed surface to inject the holes into said quantum well and which has a band gap wider than said predetermined band gap of the quantum well;
   an n-type layer which is located over the other side of said opposed surfaces to accumulate the free electrons and which has free electron energy states lower than those of the quantum well;
   a wide band gap n-type layer brought into contact with the n-type layer on the other side of said opposed surface to inject the electrons into the n-type layer;
   a barrier layer which is located between the n-type layer and the quantum well for allowing only the electrons to pass therethrough with the holes interrupted; and
   a pair of conductors deposited on said wide band gap n-type layer and said p-type layer.

2. A semiconductor light emitting device as claimed in claim 1, wherein said n-type layer has a band gap which gradually increases from an interface between said barrier layer and said n-type layer towards said wide band gap n-type layer.

3. A semiconductor light emitting device as claimed in any one of claims 1 and 2, further comprising:
   another barrier layer located between said quantum well and said p-type layer, for intercepting the electrons which flow out of said quantum well to said p-type layer so that the electrons and the holes are recombined only within said quantum well.

4. A semiconductor light emitting device as claimed in any one of claims 1 and 2, wherein said p-type layer comprises a waveguide layer which is attached to said one side of the opposed surfaces and which has a first additional band gap wider than said quantum well; and
   a cladding layer which is formed on said waveguide layer and which has a second additional band gap wider than said first additional band gap.

5. A semiconductor light emitting device as claimed in claim 3, wherein said p-type layer comprises a waveguide layer which is attached to said one side of the opposed surfaces and which has a first additional band gap wider than said quantum well; and
   a cladding layer which is formed on said waveguide layer and which has a second additional band gap wider than said first additional band gap.

* * * * *